(12) United States Patent
Zelsacher

(10) Patent No.: US 6,410,391 B1
(45) Date of Patent: Jun. 25, 2002

(54) METHOD FOR PRODUCING AN EEPROM MEMORY CELL WITH A TRENCH CAPACITOR

(75) Inventor: Rudolf Zelsacher, Klagenfurt (AT)

(73) Assignee: Infineon Technologies AG, Munich (DE)

(*) Notice: Subject to any disclaimer, the term of this patent is extended or adjusted under 35 U.S.C. 154(b) by 60 days.

(21) Appl. No.: 09/607,317

(22) Filed: Jun. 30, 2000

(30) Foreign Application Priority Data

Jul. 2, 1999 (DE) .......................... 199 30 748

(51) Int. Cl.[7] ........................... H01L 21/336
(52) U.S. Cl. ................ 438/259; 438/242; 438/246; 438/257
(58) Field of Search ................ 438/241, 242, 438/249, 257, 259, 264, 246, 247, 586

(56) References Cited

U.S. PATENT DOCUMENTS

| | | | | |
|---|---|---|---|---|
| 4,824,793 A | * | 4/1989 | Richardson et al. | 438/242 |
| 4,830,978 A | * | 5/1989 | Teng et al. | 257/302 |
| 5,064,777 A | * | 11/1991 | Dhong et al. | 438/242 |
| 5,106,776 A | * | 4/1992 | Shen et al. | 438/242 |
| 5,196,722 A | * | 3/1993 | Bergendahl et al. | 257/304 |
| 5,399,516 A | * | 3/1995 | Bergendahl et al. | 438/242 |
| 5,641,694 A | * | 6/1997 | Kenney | 438/156 |
| 6,137,128 A | * | 10/2000 | Holmes et al. | 257/296 |
| 6,150,210 A | * | 11/2000 | Arnold | 438/164 |
| 6,184,549 B1 | * | 2/2001 | Furukawa et al. | 257/301 |

* cited by examiner

*Primary Examiner*—Carl Whitehead, Jr.
*Assistant Examiner*—Jamie L. Brophy
(74) *Attorney, Agent, or Firm*—Laurence A. Greenberg; Werner H. Stemer; Ralph E. Locher

(57) ABSTRACT

The present invention provides a method for fabricating an EEPROM memory cell having a trench capacitor, having the following steps: formation of a trench (108) in a substrate (101); formation of a buried plate (165) in the substrate region in the vicinity of the lower region of the trench (108); concerted fabrication of a floating gate surrounded by dielectric layers in order to define the EEPROM region; optional recessing of the dielectric layer in order to define DRAM regions.

10 Claims, 9 Drawing Sheets

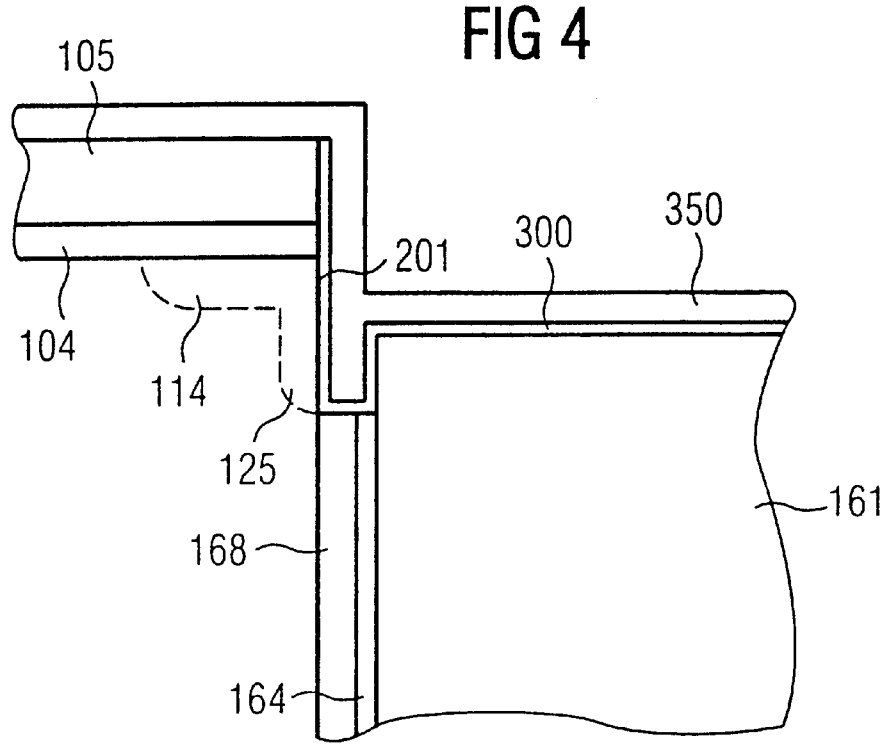
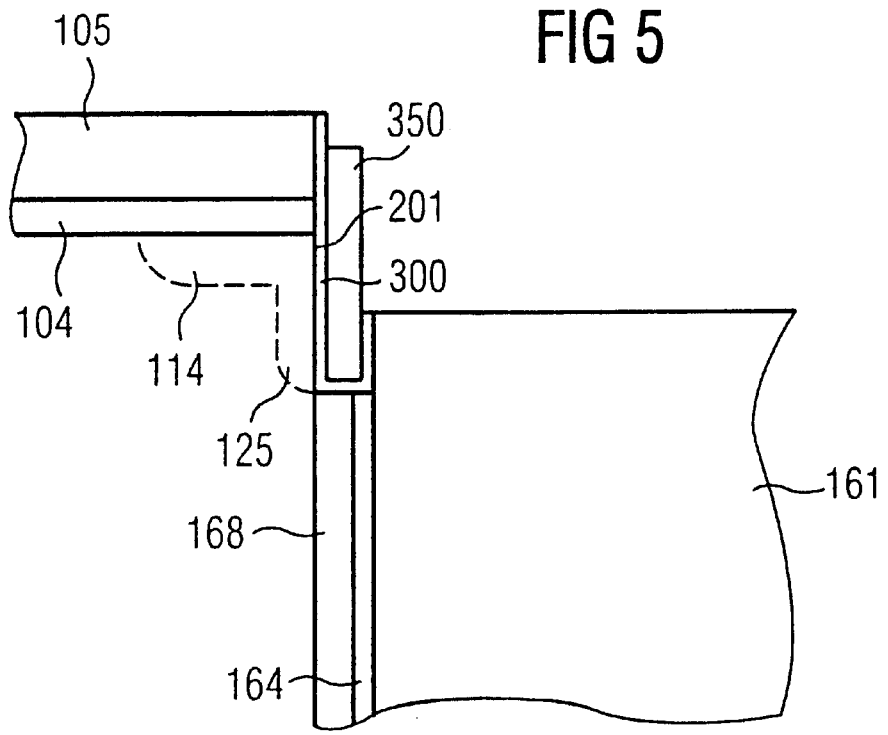

FIG 8D Prior Art
FIG 8E Prior Art
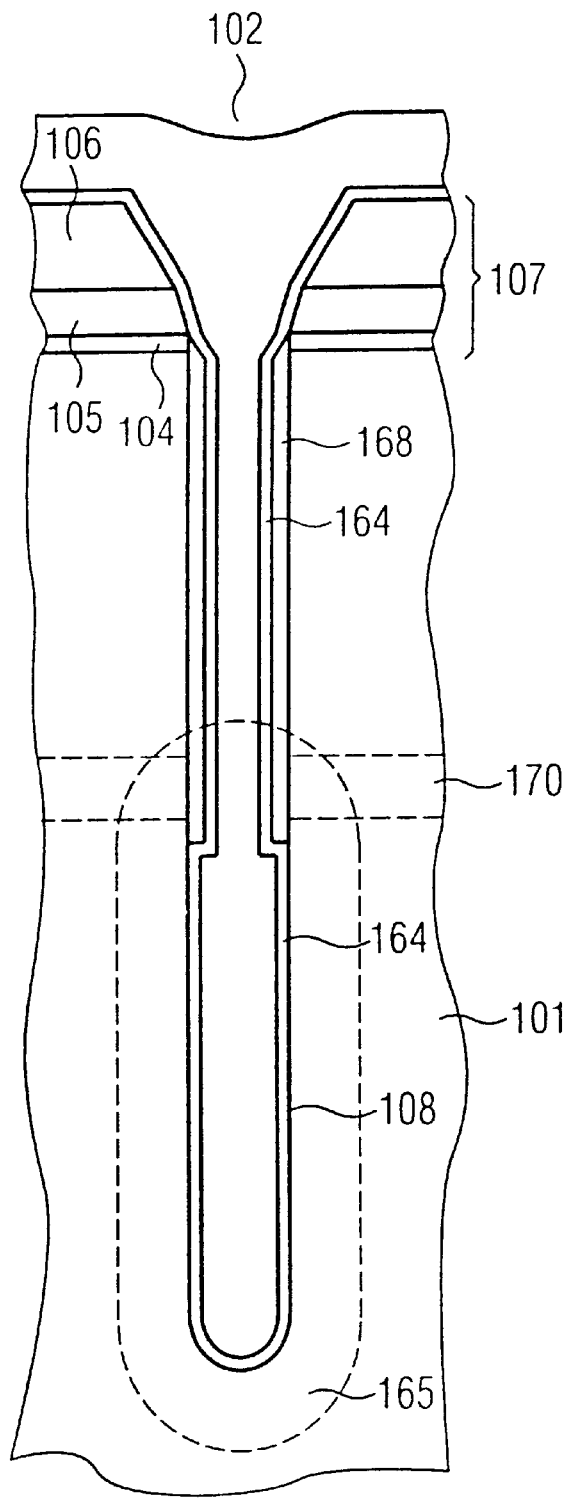
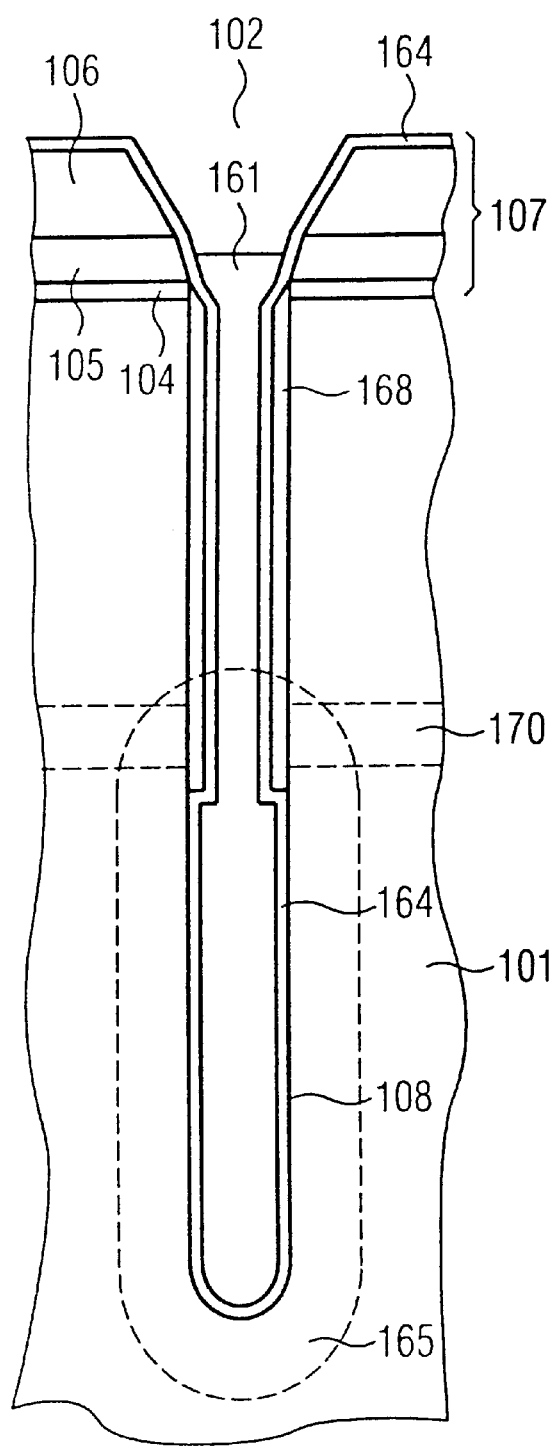

METHOD FOR PRODUCING AN EEPROM MEMORY CELL WITH A TRENCH CAPACITOR

BACKGROUND OF THE INVENTION

FIELD OF THE INVENTION

The present invention relates to a method for fabricating an EEPROM (electrically erasable programmable read only memory) memory cell.

In EEPROMs, a storage capacitor is charged and discharged with a floating gate through a tunnel oxide, the threshold voltage of an associated transistor changing as a result of this.

The present invention and the problems on which it is based will be explained below with regard to a trench capacitor used in a DRAM memory cell. Such memory cells are used in integrated circuits (ICs), such as, for example, random access memories (RAMs), dynamic RAMs (DRAMs), synchronous DRAMs (SDRAMs), static RAMs (SRAMs). Other integrated circuits contain logic devices, such as, for example, programmable logic arrays (PLAs), application-specific ICs (ASICs), mixed logic/memory ICs (embedded DRAMs) or other circuit devices. It is usual for a multiplicity of ICs to be fabricated in parallel on a semiconductor substrate, such as, for example, a silicon wafer. Alter processing, the wafer is decided in order to separate the ICs into a multiplicity of individual chips. The chips are then packaged into end products, for example for use in consumer products such as, For example, computer systems, celluar telephones, personal digital assistants (PDAs) and further products. For discussion purposes, the invention wilt be described with regard to the formation of an individual memory cell.

Integrated circuits (ICs) or chips use capacitors for the purpose of storing charge. One example of an IC which uses capacitors to store charges hs a memory IC, such as, for example, a chip for a dynamic read/write memory with random access (DRAM). The charge state ("0" or "1") in the capacitor represents a data bit in this case.

A DRAM chip contains a matrix of memory cells which are connected up in the form of rows and columns. The row connections are usually referred to as word lines and the column connections as bit lines. The reading of data from the memory cells or the writing of data to the memory cells is realized by activating suitable word lines and bit lines.

A DRAM memory cell usually contains a transistor connected to a capacitor. The transistor contains two diffusion regions separated by a channel above which a gate is arranged. Depending on the direction of the current flow, one diffusion region is referred to as the drain and the other as the source. The designations "drain" and "source" are used mutually interchangeably here with regard to the diffusion regions. The gates are connected to a word line, and one of the diffusion regions is connected to a bit line. The other diffusion region is connected to the capacitor. The application of a suitable voltage to the gate switches the transistor on and enables a current flow between the diffusion regions through the channel in order thus to form a connection between the capacitor and the bit line. The switching-off of the transistor disconnects this connection by interrupting the current flow through the channel.

The charge stored in the capacitor decreases with time on account of an inherent leakage current. Before the charge has decreased to an indefinite level (below a threshold value), the storage capacitor must be refreshed.

Ongoing endeavors to reduce the size of storage devices foster the design of DRAMs having a greater density and a smaller characteristic size, that is to say a smaller memory cell area. In order to fabricate memory cells which occupy a smaller surface region, smaller components, for example capacitors, are used. However, the use of smaller capacitors results in a reduced storage capacitance, which, in turn, can adversely affect the functionality and usability of the storage device. For example, sense amplifiers require a sufficient signal level for reliable read-out of the information in the memory cells. The ratio of the storage capacitance to the bit line capacitance is critical in determining the signal level. If the storage capacitance becomes too small, this ratio may be too small to generate a sufficient signal. Likewise, a smaller storage capacitance requires a higher refresh frequency.

One type of capacitor usually used in DRAMs is a trench capacitor. A trench capacitor has a three-dimensional structure formed in the silicon substrate. An increase in the volume or the capacitance of the trench capacitor can be achieved by etching more deeply into the substrate. In this case, the increase in the capacitance of the trench capacitor does not have the effect of enlarging the surface occupied by the memory cell.

A customary trench capacitor contains a trench etched into the substrate. This trench is typically filled with $n^+$-doped polysilicon, which serves as one capacitor electrode (also referred to as storage capacitor). Optionally, a second capacitor electrode (also referred to as "buried plate") is formed by outdiffusion of $n^+$-dopants from a dopant source into a region of the substrate which surrounds the lower portion of the trench. An $n^+$-doped silicate glass, such as, for example, an arsenic-doped silicate glass (ASG), serves as the dopant source in this case. A storage dielectric containing nitride is usually used to insulate the two capacitor electrodes.

A dielectric collar is produced in the upper region of the trench in order to prevent a leakage current from the capacitor connection with the buried plate. The storage dielectric in the upper region of the trench, where the collar is to be formed, is removed before said collar is formed. The removal of the nitride prevents a vertical leakage current along the collar.

However, the removal of the upper region of the nitride layer creates pinholes at the transition between the lower part of the collar and the upper part of the storage dielectric. Such pinholes impair the quality of the storage dielectric and are a significant source for the charge dissipation from the trench. This reduces the retention time of the trench capacitor and consequently impairs its functionality.

In order to prevent the formation of pinholes, a two-stage trench etching process has been proposed. It this case, first of all the trench is partly etched by reactive ion etching (RIE) down to the depth of the collar. The reactive ion etching is selective with regard to the etching hard mask used. The chemicals usually used for reactive ion etching comprise $NF_3/HBr/He/O_2$, for example. An oxide layer is then deposited and etched in such a way that it forms the collar on the trench sidewalls. The reactive ion etching is selective with regard to silicon if, for example, the chemicals $CHF_3/He/O_2$, $CHF_3/Ar$, $C_4F_8/Ar$ or $CF_4$ are used. The remaining region of the trench is etched once the collar has been formed. The storage dielectric is then formed over the collar and the lower region of the trench sidewalls. This method obviates the need for eliminating the upper region of the storage dielectric and hence the formation of pinholes.

Although such a two-stage trench formation process is helpful in preventing pinholes, the second reactive ion etching step for removing silicon can cause excessive erosion of the collar. Such impairment of the collar causes leakage currents to occur. Furthermore, the collar serves as an etching hard mask for the second reactive ion etching step for the purpose of fabricating the trench, which creates a lower portion of the trench with a diameter which is equal to the internal diameter of the collar. Consequently, the lower region of the trench is smaller than the upper region, which has a diameter which is approximately equal to the external diameter of the collar. This is undesirable since the capacitance of the capacitor is consequently reduced.

A customary DRAM cell will now be described with reference to FIG. 7 and a variant of the method for fabricating the DRAM memory cell according to FIG. 7 will be described with reference to FIGS. 8a–g.

The trench capacitor according to FIG. 7 contains a storage dielectric 164, which is formed in stepped fashion over the collar 168, this obviating the need for removing the upper region of the storage dielectric layer. This avoids the formation of pinholes at the transition between the collar and the upper edge of the storage dielectric layer. In addition, the lower region of the trench has a width or a diameter $W_2$ which has at least the same magnitude as the width or the diameter $W_1$ of the upper region. Accordingly, it is possible to achieve reduced leakage currents and an increased capacitance.

FIG. 7 shows the trench capacitor 160 implemented in a DRAM memory cell 100. Without restricting the generality, the DRAM memory cell 100 is a MINT cell (MINT=merged isolation node trench) with a buried strap 162. Other cell configurations, such as, those which use a strap situated on the surface, can likewise be used. The typical dimensions of a trench 108, which is implemented for example in a 256 Mb DRAM chip using 0.25 μm design rules, are approximately 7–8 μm depth, to be precise with a trench opening of about 0.25 μm by 0.50 μm.

As shown in FIG. 7, the trench capacitor 160 is formed in the substrate 101. The substrate is lightly doped with dopants of a first conduction type, for example. In this variant, the substrate 101 is lightly doped with p-type dopants (p⁻), such as B, for example. The use of a heavily doped p-type substrate (p⁺) is likewise possible. By way of example, it is possible to use epitaxially fabricated p⁺/p⁻-type substrates. Such substrates have a dopant concentration of about $10^{19}$ cm$^{-3}$ with a p⁻-type epitaxial layer having a thickness typically of 2–3 μm. The concentration of B is about $1.5 \times 10^{16}$ cm$^{-3}$. A p-type well (not shown) is provided for insulating the matrix devices. The doping concentration of the p-type wells is about $5 \times 10^{17}$ to $8 \times 10^{17}$ cm$^{-3}$.

In this variant, in contrast to the abovemetioned customary trench capacitor fabricated by the two-stage trench etching method, the lower region of the trench has a width or a diameter $W_2$ which as essentially greater than or equal to the width or the diameter $W_1$ of the upper region. Optionally, the buried plate 165 surrounds the lower region of the trench 108. As shown, the buried plate 165 partly overlaps the upper region of the trench. The buried plate 165 serves as a capacitor electrode. The trench typically contains heavily doped polysilicon 161 with a dopant of a second conduction type. By way of example, the polysilicon 161 is heavily doped with n-type dopants (n⁺), such as As or P, for example. In one variant, the polysilicon 161 is heavily doped with As. The concentration of As is about $10^{19}$ to $10^{20}$ cm$^{-3}$. The storage dielectric layer 164 isolates the capacitor electrodes. In this variant, the storage dielectric 164 lines the inner sidewalls of the collar 168 and the trench sidewalls in the lower region of the trench. By way of example, the storage dielectric layer 164 comprises nitride or nitride/oxide. Oxide/nitride/oxide or another dielectric layer or a stack of dielectric layers, such as, for example, oxide, nitride oxide or NONO, can likewise be used.

The connection of the buried plate 165 of the capacitor to other capacitors within the DRAM matrix is realized via the buried well 170, which has dopants of the second conduction type. In the present variant, the buried well 170 is formed by implantation of n-type dopants, such as As or P, for example. The concentration of the buried well 170 is about $1 \times 10^{17}$–$1 \times 10^{20}$ cm$^{-3}$. The buried well 170 can likewise be formed from an n-type epitaxial layer and be connected to a reference voltage. By connecting the buried plates 165 of the capacitors in the DRAM matrix to a common reference voltage, the maximum electric field in the dielectric layer 164 is minimized, which improves reliability. In this variant, the reference voltage has a value in the middle between the L voltage of the bit line and the H voltage of the bit line, which usually corresponds to half of the supply voltage or $V_{DD}/2$. Other reference voltages, such as ground potential, for example, can likewise be used.

The strap 162 is provided above the doped polysilicon 161. The dopants from the doped polysilicon 161 outdiffuse into the silicon in order to form the capacitor connection diffusion region 125 or the capacitor connection which connects the transistor 110 to the capacitor 160.

The collar 168 is formed in the upper region of the trench 108 and extends as far as the top side of the buried plate 165. As shown, the collar 168 is drawn back to a point slightly below the substrate 101, in order to accommodate the buried strap 162. The collar 168 is fabricated from a dielectric material. In the present variant, first of all a thermal oxide layer is formed and a TEOS layer is deposited thereon. The collar 168 prevents or reduces the leakage current from the capacitor connection 162 to the buried plate 165. In one variant, the collar has a depth of about 1.2 μm and a thickness of 20 to 90 nm.

The STI trench 180 is provided in the upper portion of the trench 108 for the purpose of insulating the DRAM cell from other cells in the matrix and for the purpose of preventing strap formation between adjacent capacitors. As shown, the STI trench 180 overlaps a region of the trench 108 and leaves a remaining region open, with the result that current can flow between the transistor 110 and between the capacitor 160. In the present variant, the STI trench 180 nominally overlaps about half of the trench width. The STI trench prevents or reduces the leakage current from strap to strap. The depth of the STI trench is about 0.25 μm.

In this variant, moreover, the buried strap 162 has a polysilicon filling/buried strap interface designated by 200 as well as a buried strap/substrate interface designated by 201, which will be discussed again in more detail in the context of a variant described below.

The transistor 110 comprises the gate stack 112 and the drain/source diffusion regions 113 and 114. The diffusion regions 113, 114 have n-type dopants, such as As or P, for example. The diffusion region 114 is connected to the capacitor connection 125. The gate stack 112, which is connected to the word line 120, comprises a polysilicon layer. The polysilicon is typically doped with n- or p-type dopants. A metal silicide layer (not shown) is optionally formed over the polysilicon layer in order to reduce the sheet resistance of the gate stack 112. The polysilicon and the silicide are often referred to as "polycide(s)".

The gate stack 112 is covered with a nitride layer, which is used as an etching mask for the purpose of insulating the word line. In addition, a sidewall oxide (not shown) and a lining are used in order to insulate the word line 120. The lining comprises nitride, for example, or another suitable material. The lining likewise serves as an etching stop during the formation of the edgeless contact 183. The edgeless contact affords a connection between the diffusion region 113 and the bit line 185. The dielectric layer 189, which is composed of BPSG, for example, or another dielectric material, such as an oxide, for example, insutates the bit line 185 from the diffusion regions 113, 114.

The word line 120' that runs past is formed above the STI trench 180. The word line 120' that runs past is insulated from the trench 108 by the STI trench 180 and a thick covering oxide. In the present variant, the edges of the word line that runs past are essentially aligned with the trench sidewalls. Such a configuration is referred to as a folded bit line architecture. Other configurations, such as, for example, an open or an open/folded structure, can likewise be used.

As described, the first conduction type is the p-type and the second conduction type is the n-type. The invention can likewise be applied to trench capacitors which have formed p-type polysilicon in an n-type substrate. Furthermore, it is possible for the substrate, the wells, the buried plate and the other elements of the DRAM memory cell to be heavily or lightly doped with impurity atoms in order to obtain the electrical characteristics desired in each case.

Although the first electrical conduction type is the p-type and the second electrical conduction type is the n-type, it is likewise possible to form the DRAM memory cell in an n-type substrate with a trench filled with p-type polysilicon. Furthermore, it is possible to use a vertical transistor or other types of memory cell layouts.

FIGS. 8a–g show a variant of the method for fabricating the DRAM memory cell according to FIG. 7.

With reference to FIG. 8a, the substrate 101 is provided, on which subscrate the DRAM memory cell is to be fabricated. The main surface of the substrate 101 is not critical, and any desired suitable orientation, such as, for example, (100), (110) or (111), can be used. In the present variant, the substrate 101 is lightly doped with p-type dopants (p$^-$), such as B, for example. reconcentration of B is about $1-2\times10^{16}$ cm$^{-3}$.

The substrate 101 contains the n-doped buried well 170. The buried well 170 has P or As as dopant. In the present variant, a mask is patterned in order to define the buried well regions. n-type dopants are then implanted into the buried well regions of the substrate 101. The buried well 170 serves to insulate the p-type well from the substrate 101 and likewise forms a conductive strap between the buried plates 165 of the capacitors. The dose and energy of the implantation are approximately $>1\times10^{13}$ cm$^{-2}$ at about 1.5 MeV. As an alternative, the buried well 170 is formed by implantation and subsequent growth of an epitaxial silicon layer above the substrate surface. This technique is described in U.S. Pat. No. 5,250,829 by Bronner et al.

The substructure stack 107 is formed on the surface of the substrate 101. By way of example, the substructure stack 107 comprises the substructure oxide layer 104 and the substructure stop layer 105. The substructure stop layer 105, which serves as polish or etching stop for subsequent processes, has nitride, for example. Provided above the substructure stop layer 105 is the hard mask layer 106. This hard mask layer 106 comprises TEOS. Other materials, such as BSG, for example, can likewise be used as the hard mask layer. In addition, an antireflection coating (ARC) can be used in order to improve the lithographic resolution.

The hard mask layer 106 is patterned using customary photolithogranhic techniques, in order to define the region 102 in which the trench is to be formed. These steps include the deposition of a photoresist layer and the selective exposure thereof with the desired pattern The photoresist is then developed and either the exposed or the unexposed regions are removed, to be precise depending on whether a positive resist or a negative resist is used. The exposed regions of the substructure stack 107 are then etched down to the surface of the substrate 101. A reactive ion etching step (RIE) then forms the deep trench 108.

A polysilicon semiconductor layer 152 is then deposited over the wafer in order to fill the trench 108. Amorphous silicon can likewise be used. Further types of material which have temperature stability up to 1050 to 1100° C. and can be removed selectively with respect to nitride or oxide can likewise be used. The polysilicon 152 is referred to as a polysilicon sacrificial layer, since it is later removed. A natural oxide 151 is typically formed, which oxide lines the trench sidewalls before the trench is filled with the polysilicon 152. The oxide layer 151 typically has a thickness of about 0.3–0.5 nm.

As shown in FIG. 8b, the polysilicon 152 is then removed down to the underside of the collar to be formed. The removal of the polysilicon 152 comprises, by way of example, planarization by means of chemical mechanical polishing, chemical dry etching (CDE) or reactive ion etching for the purpose of forming a coplanar surface with the top side of the polysilicon in the trench 108 and at the top side of the substructure stack 107. Reactive ion etching is then carried out in order to sink the polysilicon 152 in the trench 108. The use of chemical dry etching to lower the polysilicon 152 in the trench 108 is likewise possible. Preferably, however, the polysilicon 152 is planarized and sunk, typically by 0.5–2 $\mu$m from the substrate surface, by CDE or RIE in a single step.

A dielectric layer is then deposited over the wafer, and covers the substructure stack 107 and the trench sidewalls. The dielectric layer is used to from the collar 168. The dielectric layer is made of oxide, for example. In the present variant, the dielectric layer is formed by the growth of a layer of thermal oxide and the subsequent deposition of an oxide layer by chemical vapor phase deposition (CVD), such as, for example, plasma-enhanced CVD (PECVD) or low-pressure CVD (LPCVD), using TEOS. The CVD oxide can be densified by a heat-treatment step. The oxide layer is thick enough to avoid a vertical leakage current, namely 10–50 nm. As an alternative, the dielectric layer can have a layer of thermal oxide.

In another variant, the dielectric layer is formed from CVD oxide. After the CVD oxide has been formed, a heat-treatment step may be carried out in order to densify the oxide. The heat-treatment step is carried out for example in Ar, $N_2$, $O_2$, $H_2O$, $N_2O$, NO or $NH_3$ atmosphere. An oxidizing atmosphere, such as $O_2$ or $H_2O$, for example, can be used to form a thermal oxide layer under the CVD oxide. Oxygen from the atmosphere then diffuses through the CVD oxide to form a thermal oxide layer on the substrate surface. This advantageously enables the formation of a thermal oxide, if desired, without the need for a thermal oxidation step prior to the deposition of the CVD oxide. The heat-treatment step is typically carried out at a temperature of about 1000–1100° C. and for about 0.5–3 hours.

Furthermore, with reference to FIG. 8b, the dielectric layer is etched by reactive ion etching, for example, in order to form the collar 168. The chemical agents for the reactive ion etching are chosen in such a way that the oxide as etched selectively with respect to the polysilicon 152 and the nitride 106. The reactive ion etching removes the dielectric layer from the surface of the substructure stack and the bottom of the opening. The dielectric layer remains on the silicon sidewall in order to form the collar 168. As illustrated in FIG. 8b, the upper region of the collar 168 is slightly eroded and forms a beveled upper portion.

With reference to FIG. 8c, the polysilicon sacrificial layer 152 is removed from the underside of the trench 108. The removal of the polysilicon sacrificial layer 152 is preferably achieved by CDE. The thin natural oxide layer 151 is then typically present on the uncovered trench sidewalls. This thin natural oxide layer 151 can suffice to serve as CDE etching stop. A CDE etching step, for example using $NF_3$+ $Cl_2$ as chemicals, can etch silicon or polysilicon with relatively high selectivity with respect to oxide, which makes it possible to remove the polysilicon using the thin natural oxide layer 151 as an etching stop. By way of example, a selectivity of about 4000:1 was determined for the removal of the polysilicon from the trench 108 using the natural oxide 151 as an etching stop layer.

In another variant, a CDE step with a high $Cl_2$ content is used in order to increase the selectivity of the silicon and/or polysilicon etching with respect to the oxide. A flow rate of about 12 sccm results in an effective oxide etching rate of zero, while the polysilicon etching rate is of the order of magnitude of about 2 $\mu$m/min. This enables the natural oxide layer 151 to serve as an efficient etching stop for the removal of the sacrificial polysilicon layer. The thickness of the natural oxide 151 is typically about 0.3 to 0.5 nm.

As an alternative, wet etching, for example using KOH or HF:$HNO_3$:$CH_3COOH$, can likewise be used during the removal of the polysilicon. However, the use of KOH may lead to K contamination on the trench sidewall, which may require an additional cleaning step. Reactive ion etching is likewise possible during the removal of the polysilicon since it acts anisotropically. Suitable chemicals for the reactive ion etching for eliminating the polysilicon contain $SF_6$/$NF_3$/HBr. Other suitable chemicals which etch polysilicon selectively with respect to oxide or nitride are, by way of example, $NF_3$/HBr or $CF_4$/$O_2$ or $CF_4$/$O_2$/$Cl_2$.

The selectivity of the reactive ion etching regarding poly with respect to oxide or nitride is approximately less than 100:1 on planar surfaces but rises to more than approximately 2000:1 on vertical surfaces, to be precise on account of the preferably vertical direction of movement of the ions during the reactive ion etching. On account of the high selectivity of the polysilicon with respect to oxide or nitride on the vertical surfaces, only the upper region of the collar 168 is eroded. This is not a problem, however, since the collar 168 is not eroded below the surface of the substrate.

After the polysilicon has been removed, the buried plate 165 with n-type dopants, such as As or P, for example, is optionally formed as the second capacitor electrode. The collar 168 serves as an insulation mask enabling only the region underneath the collar 168 to be doped. The concentration of the dopants is about $1\times10^{19}$–$10^{20}$ cm$^{-3}$. In order to form the buried plate 165, it is possible to use vapor phase doping using $PH_3$ or $AsH_3$, plasma doping or plasma immersion ion implantation (PIII). Such techniques are described for example in Ransom et al., J. Electrochemical. Soc. Volume 141, No. 5 (1994), pp. 1378 ff.; U.S. Pat. Nos. 5,344,381 and 4,937,205.

Ion implantation using the collar 168 as an insulation mask is likewise possible. As an alternative, the buried plate 165 can be formed using a doped silicate glass, such as ASG, for example, as dopant source. The use of doped silicate glass as dopant source is described for example in Becker et al., J. Electrochemical. Soc., Volume 136 (1989), pp. 3033 ff. If doped silicate glass is used, the layer is removed after the formation of the buried plate.

With reference to FIG. 8d, a storage dielectric layer 164 is deposited on the wafer and covers the surface of the substructure stack 107 and the interior of the trench 108. The storage dielectric layer 164 serves as a storage dielectric for separating the capacitor plates. In one variant, the dielectric layer comprises an NO film stack. The NO film stack is formed by deposition of a nitride layer which is then reoxidized. The nitride layer is formed for example by thermal nitration and CVD nitride with a thickness of about 5 nm. The nitride layer is reoxidized at a temperature of about 900° C., by way of example. The reoxidation of the nitride layer marginally increases the thickness of the nitride layer. Further types of dielectric film stacks, such as, for example, oxide-nitride-oxide (ONO) or oxide-nitride-oxide-nitride (ONON), are likewise useful. The use of a thin oxide, nitride or nitrated oxide film is likewise possible.

A further polysilicon layer 161 is deposited on the surface of the wafer for the purpose of filling the trench 108 and for the purpose of covering the substructure stack 107, to be precise by means of CVD, for example, or other known techniques. As shown, the polysilicon layer 161 is conformal and doped with n-type dopants, such as P and As, for example. In one variant, the polysilicon layer 161 is doped with As. The concentration of As is about $1\times10^{19}$–$1\times10^{20}$ cm$^{-3}$. The doped polysilicon 161 serves as a capacitor electrode. As an alternative, the layer may be composed of amorphous silicon. This material can be doped either in situ or sequentially.

With reference to FIG. 8e, the polysilicon layer 161 is lowered for example by a CDE step or by an RIE step using suitable chemicals, such as, for example, $NF_3$/$Cl_2$ or $NF_3$/HBr or $SF_6$. In another variant, the polysilicon 161 is lowered to approximately the level of the substructure nitride 106. This advantageously protects the substructure oxide 105 during the subsequent wet etching processes. If the undercutting does not constitute a problem, the polysilicon can be sunk as far as the depth of the buried strap.

In accordance with FIG. 8f, the residual storage dielectric layer 164 above the polysilicon 161 is removed by wet etching, to be precise using DHF and HF/glycerol, for example. The hard mask layer 106 is then likewise removed wet-chemically, to be precise using BHF. It is also possible to carry out a CDE step for this purpose. The hard mask layer can also be removed earlier in the process sequence, such as, for example, after the formation of the deep trench 108. As shown, the collar 168 and the dielectric layer 164 are likewise slightly sunk in the trench 108.

As shown in FIG. 8g, the buried strap 162 is then formed. The formation of the buried strap 162 is achieved, by way of example, by etching for the purpose of sinking the doped polysilicon 161 in the trench. Reactive ion etching is typically used for this purpose. The non-active region of the cell is there defined by a customary photolithographic technique and then anisotropically etched, to be precise expediently by reactive ion etching. The non-active region is the region in which the STI trench 180 is to be formed.

As shown with renewed reference to FIG. 7, the STI trench 180 overlaps part of the trench in order, in this way, to deposit part of the strap 162. In a subsequent heat-treatment step, dopants from the doped polysilicon 161 diffuse upward and outward through the strap 162 in order to form the diffusion region 125. The depth of the STI trench is about 0.25 μm. The non-active region is typically etched underneath the top side of the oxide of the collar 168. In one variant, the non-active region is etched about 0.25 μm below the substrate surface.

After the non-active region has been etched, the photoresist and ARC layers are removed. In order to ensure that no photoresist or ARC residues remain behind, cleaning steps can be used. In order to prevent oxygen from diffusing into the silicon and polysilicon sidewalls, an optional lining (not shown) is provided in order to protect the non-active region. The lining comprises nitride, for example. A passivation oxide is typically grown thermally on the uncovered silicon prior to the formation of the nitride lining. The nitride lining is formed by low-pressure chemical vapor deposition (LPCVD), for example.

A dielectric material is formed on the surface of the substrate. The dielectric material has $SiO_2$, for example. In a further variant, the dielectric material is TEOS. A high-density plasma (HDP) oxide or another insulation material can be used. The thickness of the dielectric layer suffices to fill the non-active region. Since the dielectric layer is typically conformal, planarization methods, such as chemical mechanical polishing, for example, are employed. Such methods are described for example in Nesbit et al., A 0,6 $μm^2$ 256 Mb Trench DRAM Cell with Self-Aligned Buried Strap (BEST), IEDM 93–627. The surface of the substrate 101 is then polished in such a way that the STI trenches 180 and the nitride layer are essentially planar.

The substructure stop layer 105 is then removed by wet chemical etching, for example. The wet chemical etching is selective with respect to oxide. The substructure oxide 104 is likewise removed at this point by wet chemical etching which is selective with respect to silicon. After the removal of the substructure oxide 104, an oxide layer is formed on the surface of the wafer. This oxide layer, which is referred to as a gate sacrificial layer, serves as a screen oxide for subsequent implantations.

In order to define a region for a p-type well for the n-channel transistor 110 of the DRAM memory cell, a photoresist layer is deposited on the top side of the oxide layer and suitably patterned in order to uncover the p-type well region. As shown, p-type dopants, such as boron (B), for example, are implanted into the well region. The dopants are implanted to a depth sufficient to prevent punch-through and to reduce the sheet resistance. The dopant profile is dimensioned in such a way that the desired electrical characteristics are obtained, for example a desired gate threshold voltage ($V_{th}$).

In addition, p-type wells are likewise formed for the n-channel supply circuit arrangement. n-type wells are formed for complementary wells in complementary metal oxide silicon devices (CMOS). The formation of n-type wells additionally requires photolithographic steps and implantation steps in order to define and form the n-type wells. As in the case of the p-type wells, the profiles of the n-type wells are tailored to achieving the desired electrical characteristics. Once the wells have been Lormed, the gate sacrificial layer is removed.

The various layers for forming the gate 112 of the transistor 110 are then fabricated. This comprises the formation of a gate oxidation layer, which serves as gate oxide, a polysilicon layer and a covering nitride layer. The polysilicon layer may typically contain a metal silicide layer, such as $WSi_x$, for example, the polycide formed reducing the sheet resistance. The various gate layers are then patterned in order to form the gate stack 112 of the transistor 110. The sidewall of the gate stack is then insulated by thermal oxidation, for example.

A gate stack that runs past as word line 120' is typically formed above the trench and is insulated from the latter by the STI trench 180. The source/drain diffusion regions 113 and 114 are formed by implantation of n-type dopants, such as P or As, for example. In one variant, P is implanted into the source and drain regions 113, 114. The dose and the energy are selected in such a way that a dopant profile is obtained which ensures the desired operating characteristics. In order to improve the diffusion and the alignment of the source and the drain with the gate, it is possible to use nitride spacers (not shown). The diffusion region 114 is connected to the diffusion region 125 in order, in this way, to form the capacitor connection.

The dielectric layer 189 is formed over the wafer surface, and it covers the gates 112 and the substrate surface. The dielectric layer comprises BPSG, for example. Further dielectric layers, such as TEOS, for example, are likewise useful. As shown, an edgeless contact opening 183 is etched in order to uncover the diffusion region 113. The contact opening is then filled with a conductive material, such as $n^+$-doped polysilicon, for example, in order to form a contact plug therein. The metal layer 185, which represents a bit line, is formed over the dielectric layer in order to form a contact with the source via the contact plug. The structure shown in FIG. 7 is finally obtained in this way.

SUMMARY OF THE INVENTION

The object of the present invention consists, therefore, in specifying a simple method for fabricating an EEPROM (electrically erasable programmable read only memory) memory cell which is based on the DRAM fabrication method explained above or on a similar method.

According to the invention, this object is achieved by means of the method for fabricating an EEPROM (electrically erasable programmable read only memory) memory cell which is specified in claim 1.

The idea on which the present invention is based consists in transferring a DRAM process which is known per se to an EEPROM process by making modifications to the trench processing steps.

The EEPROM cell is produced from the DRAM cell referred to in detail above by the sole non-insulated part of the DRAM cell—the interface 201 between the strap 162 and the diffusion region 125—being formed as a tunnel layer (cf. FIG. 21). As a result, the inner conductive region of the cell 161, 162, 350 becomes the so-called floating gate, which can be charged and discharged via the tunnel layer 300. Part of the EEPROM cell is a vertical transistor with 125, 165 as source and drain, respectively, and the poly layers 161, 162, 350 as floating gate and 168 as oxide.

The channel of this vertical transistor from 125 to 165 is conductive or non-conductive depending on the charge content of the EEPROM cell, which is synonymous with the voltage on the floating gate. As a result, the two logic states "0" and "1" can be written, read and erased.

In this case, the essential modifications are the use of a special base material, the application of a tunnel oxide and of a conductive protective layer (for example poly spacer) above the tunnel oxide. This protective layer is chosen in such a way that it creates a low-resistance contact with the strap—known per se—in the upper part of the trench.

The advantages of the present invention reside in the fact that the development outlay of the DRAM process can be taken into account for the corresponding EEPROM process. The cell density of the EEPROM cells is identical to that of the DRAM cells. In principle, it is possible to produce EEPROM cells and DRAM cells simultaneously and on the same substrate in this way.

The subclaims relate to preferred developments.

In accordance with one preferred development, the substrate used is a heavily p-doped semiconductor material (166 in FIG. 1) with a layer p⁻ (p minus) having a thickness a few μm thereon (167 in FIG. 1). The p³¹ -type layer has the B concentration of the DRAM process and CMOS elements, resistors, diodes and diffusions are realized on its surface, as described above.

In accordance with a further preferred development, the step of removal of the second filling material and of the insulation collar in the upper region of the trench in order to uncover the buried contact with a selection transistor is carried out. The step of application of the tunnel layer on the interface of the buried contact and the conductive second filling material is then carried out. Finally, the step of application of the protective layer on the tunnel layer is carried out. The protective layer and the tunnel layer situated underneath are etched, with the result that the protective layer and the tunnel layer situated underneath are removed from the conductive second filling material and remain in the region of the interface.

In this state, the EEPROM regions are protected by the application and patterning of photoresist. On the other hand, wherever there is no photoresist, the dielectric is removed in the region 201 by means of etching. In the specific example described in more detail below, the poly spacer and the tunnel layer are removed. The known DRAM cells are produced in the further course of the process.

In accordance with a further preferred development, the step of formation of a strap above the insulation collar on the conductive second filling material from a third conductive a filling material to the protective layer after the anisotropic etching is carried out, and the step of planarization and sinking of the strap is carried out. Finally, the step of formation of an STI trench in the upper portion of the trench for the purpose of insulating the EEPROM cell from other cells in the matrix and for the purpose of preventing strap formation between adjacent capacitors is carried out.

In accordance with a further preferred development, polysilicon is used as the second (161) and third (162) conductive filling material and for the protective layer (350).

Exemplary embodiments of the present invention are illustrated in the drawings and explained in more detail in the description below.

BRIEF DESCRIPTION OF THE DRAWING

FIGS. 2 to 6 show an embodiment of the invention's method for fabricating the EEPROM memory cell;

FIGS. 8*a–g* show an example of a known method for fabricating the DRAM memory cell according to FIG. 7.

DESCRIPTION OF THE PREFERRED EMBODIMENT

In the figures, identical reference symbols designate identical or functionally identical elements.

Figure 1:
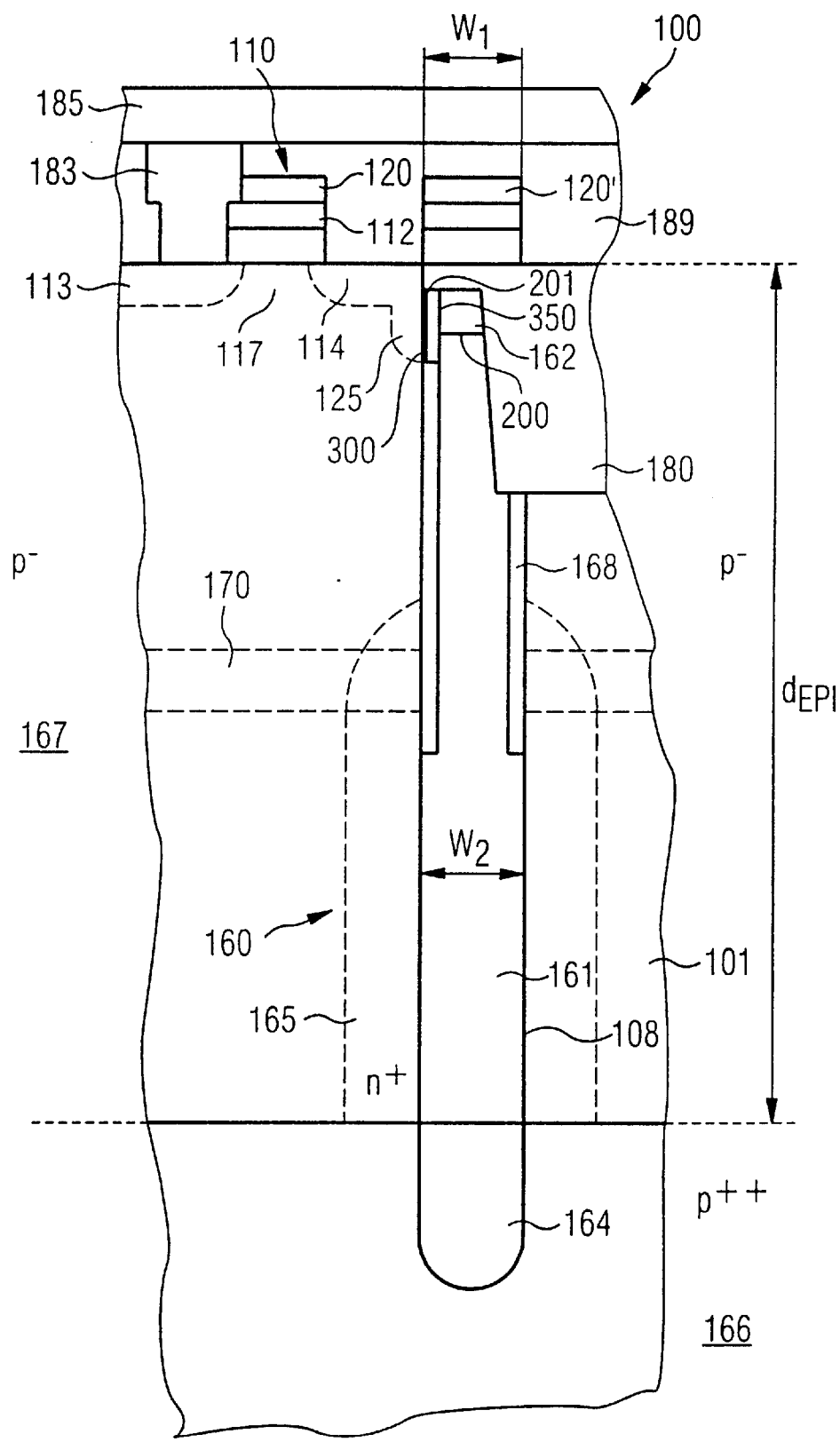
FIG. 1 shows the DRAM cell according to FIG. 7 converted into an EEPROM cell.
Figure 7:
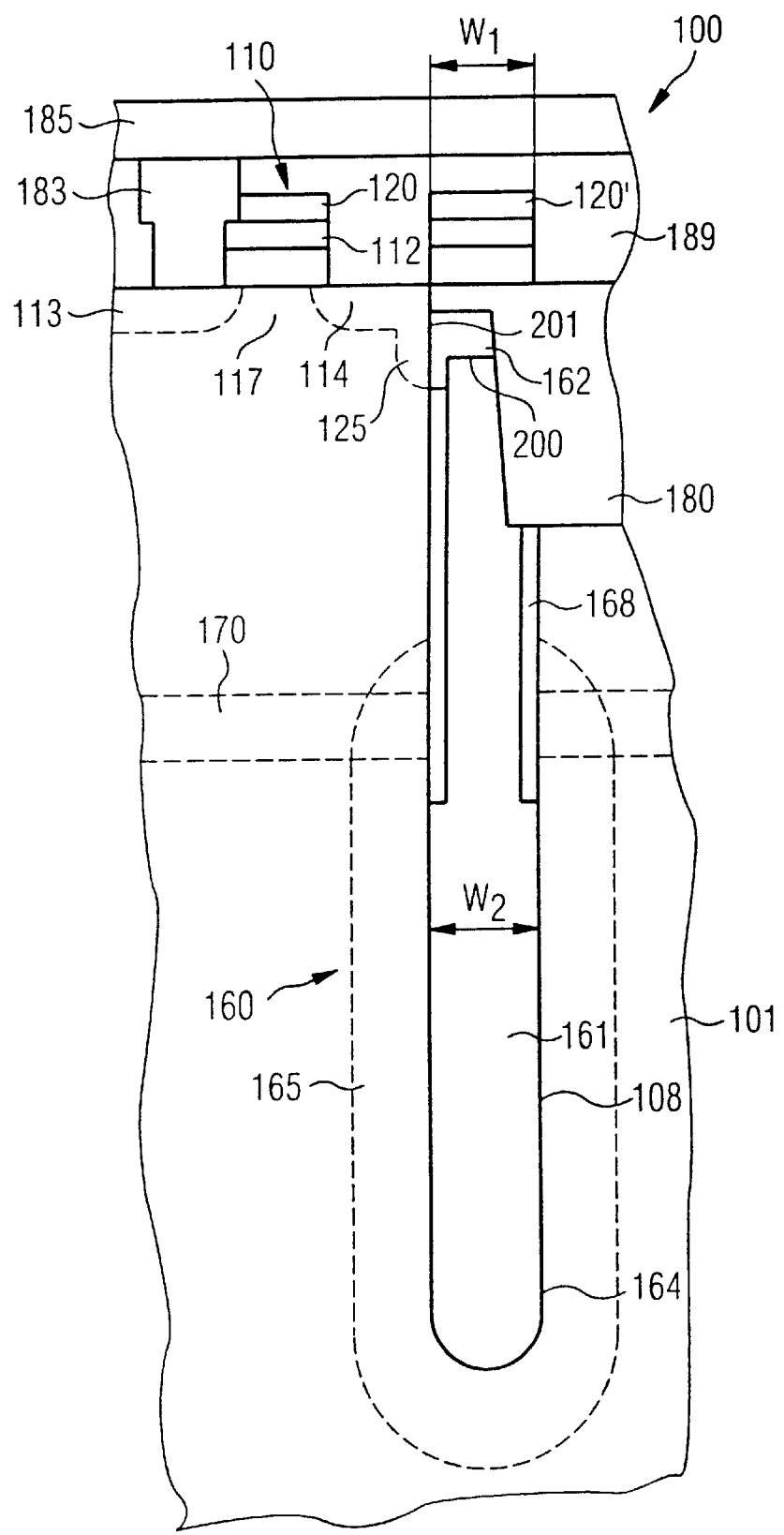
FIG. 7 shows an example of a customary DRAM cell.

FIG. 1 shows the DRAM cell according to FIG. 7 converted into an EEPROM cell, and FIGS. 2 to 6 show an embodiment of the invention's method for fabricating an EEPROM memory cell.

The special base material used for the fabrication method according to the invention is a P⁺⁺-type substrate, on which a p⁻-type layer having a thickness of a few micrometers, doped in a manner corresponding to the DRAM substrate, is grown epitaxially (cf. FIG. 1 166 p⁺⁺, 167 p⁻).

The basic idea is to isolate the DRAM memory cell known per se from the drain region of the associated selection transistor through a tunnel oxide with a protective layer situated thereon, and thus to provide a completely insulated EEPROM memory cell.

The EEPROM cell is produced from the DRAM cell referred to in detail above by the sole non-insulated part of the DRAM cell—the interface 201 between the strap 162 and the diffusion region 125—being formed as a tunnel layer. As a result, the inner conductive region of the cell 161, 162, 350 becomes the so-called floating gate, which can be charged and discharged via the tunnel layer 300. Part of the EEPROM cell is a vertical transistor with 125, 165 as source and drain, respectively, and the poly layers 161, 162, 350 as floating gate and 168 as oxide.

In particular, this is accomplished by the formation of a buried plate 165 in the substrate region 167 (the substrate region 166 remains p-type on account of its high doping, and the region 167 changes to n-type conduction). When a dielectric is formed on the trench walls, it is essential for this dielectric to be continuous for the EEPROM cell (that is to say to be composed of the regions 164, 168, 300, 180 in our application example), whereas it is recessed (not present) for the DRAM cell in the region 201. The structure of the dielectric depends on the desired electrical properties of EEPROM and DRAM. In the example shown here, the DRAM dielectric is taken and terminated with tunnel layer and poly spacer for the EEPROM cell.

Furthermore, conductive filling material is filled and partially (0–100%) removed for the purpose of fabricating the inner capacitor plate (of the floating gate). This point can be seen in connection with the fabrication of the dielectric referred to above (that is to say dielectric and filling are in part mutually dependent). The counterelectrodes are formed by diffusion 125, substrate p minus 167, diffusion n+165 & 170 and substrate p⁺⁺166. 152, 161, 350 & 162 serve as filling material in this example.

What is essential about the EEPROM fabrication, therefore, is the formation of a floating gate enclosed by insulators, and what is essential about the DRAM is a region which is almost completely enclosed by insulators and has—in the case of the BEST cell—ohmic contact with the diffusion 125. The modification of the BEST cell—referred to above—with tunnel layer and poly spacer is one specific change; many others are also conceivable.

The method optionally implements a photographic technique and etchings in order to define DRAM regions. In this case, the dielectric is removed in the region 201 in order to enable the contact of inner electrode with diffusion 125. In the example here, specifically the poly spacer and the tunnel layer in the DRAM regions are removed again for that purpose. The process is then continued in known fashion with strap and STI insulation.

Figure 2:
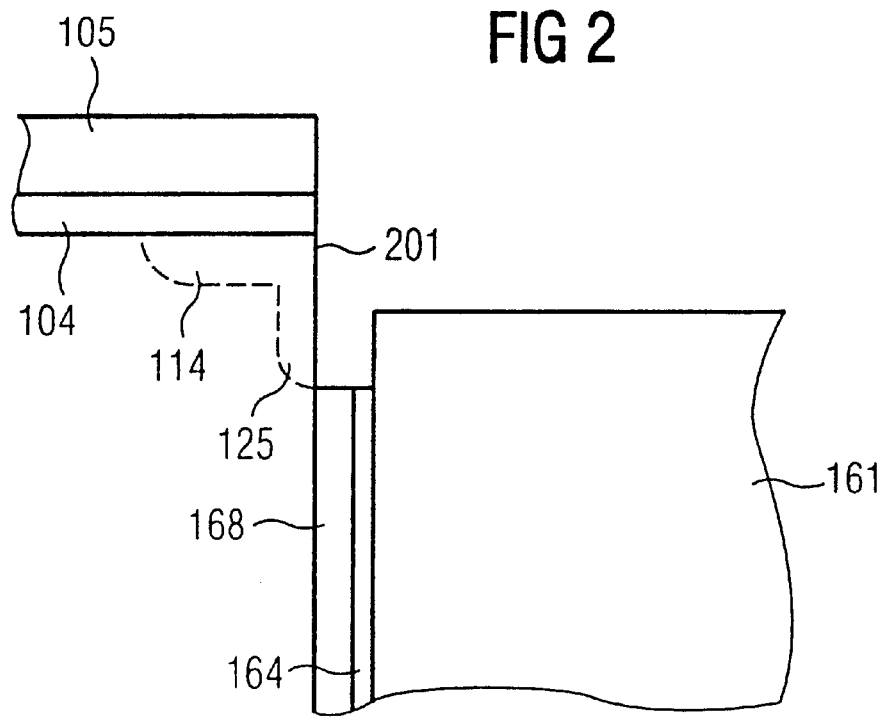
Figure 8A:
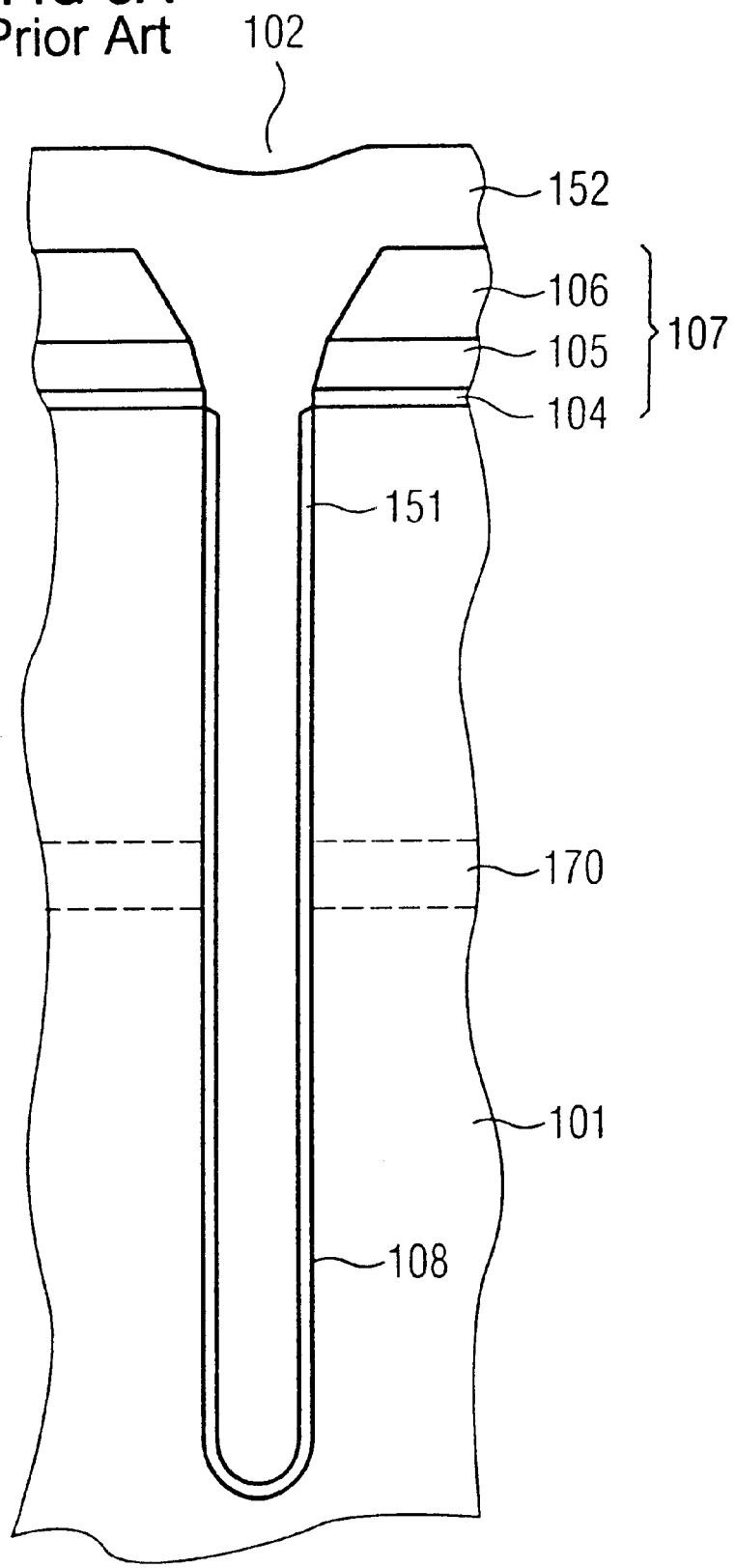
Figure 8B:
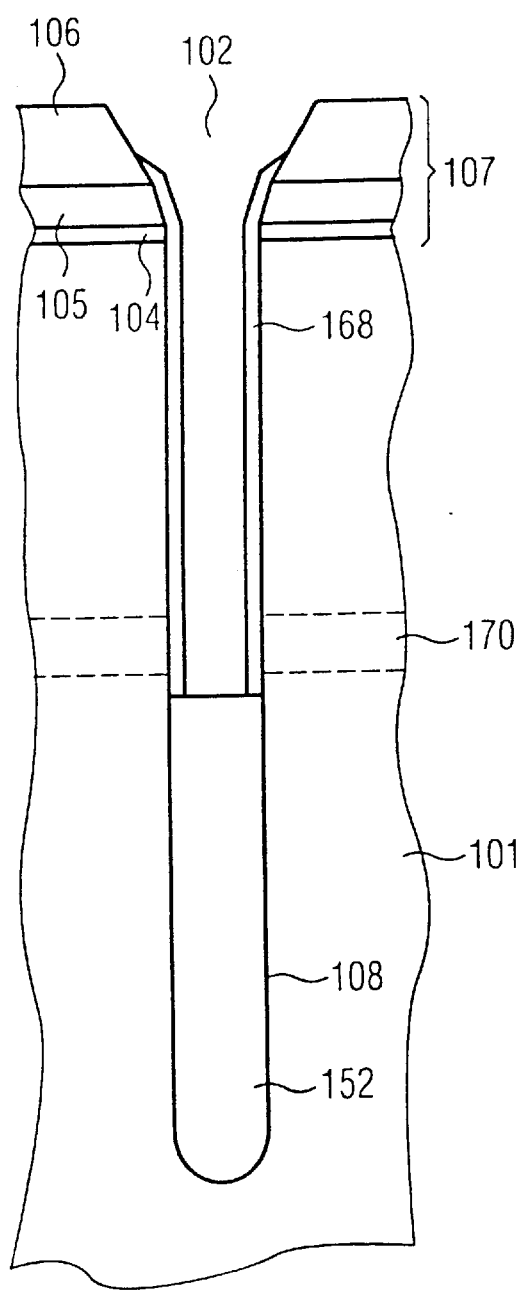
Figure 8C:
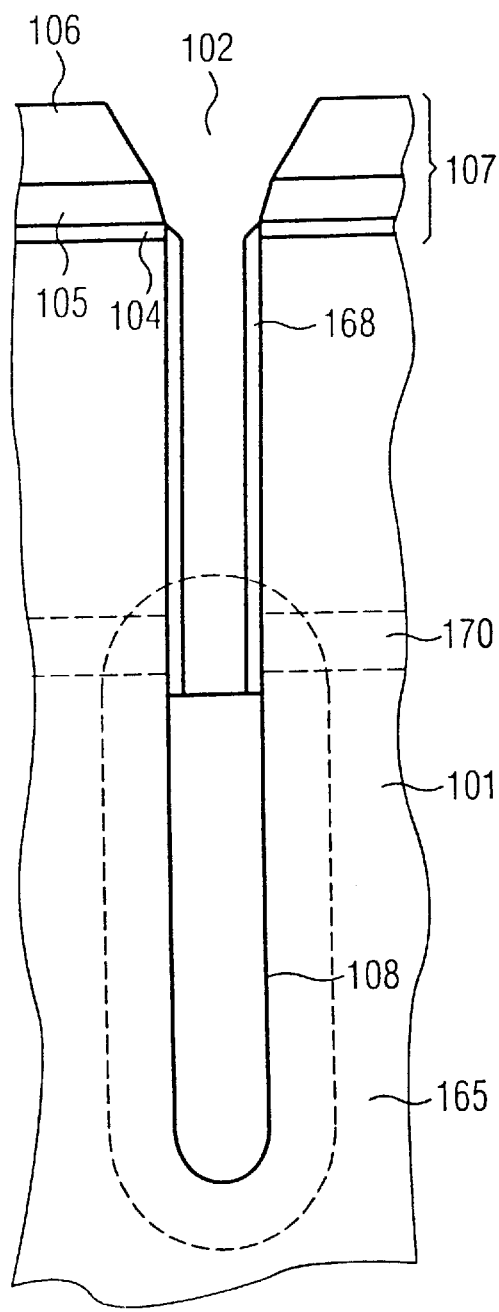
Figure 8F:
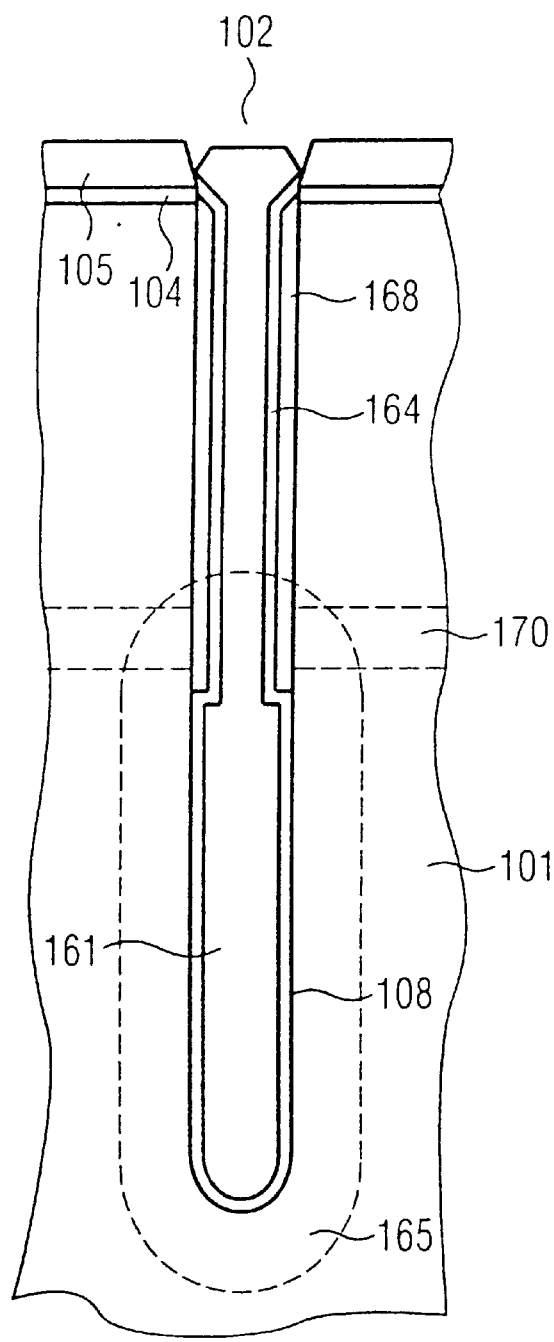
Figure 8G:
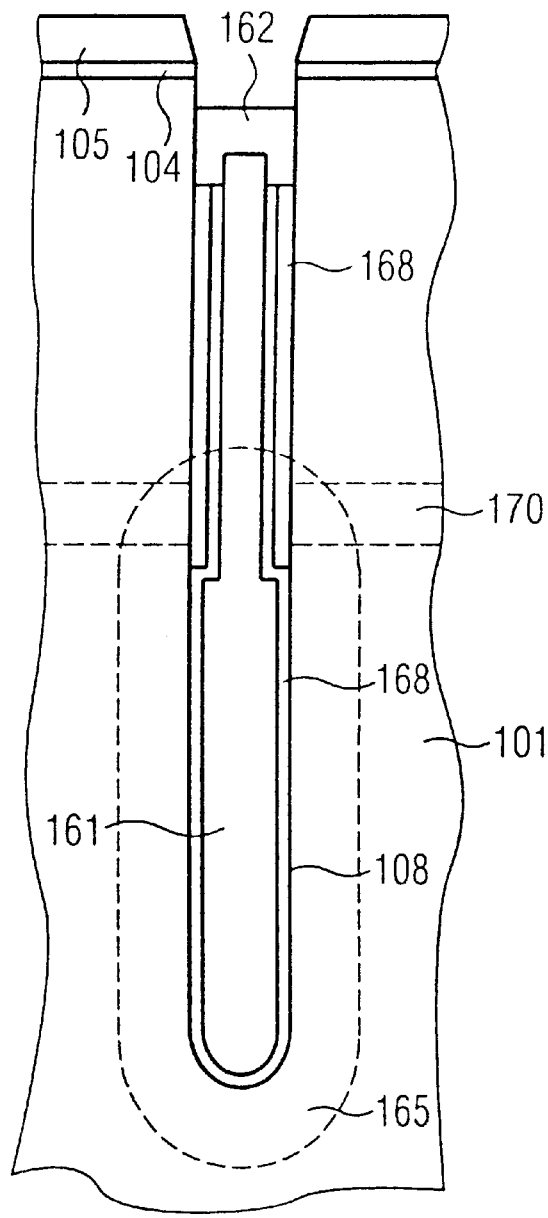

Up to the process stage shown in FIG. 2, no modification is made to the DRAM standard process described in detail in the introduction. In particular, the process stage shown in FIG. 2 lies between that of FIGS. 8*f* and 8*g*, namely before the deposition of the layer for the strap 162, that is to say after the etching of the insulating collar 168.

Figure 3:
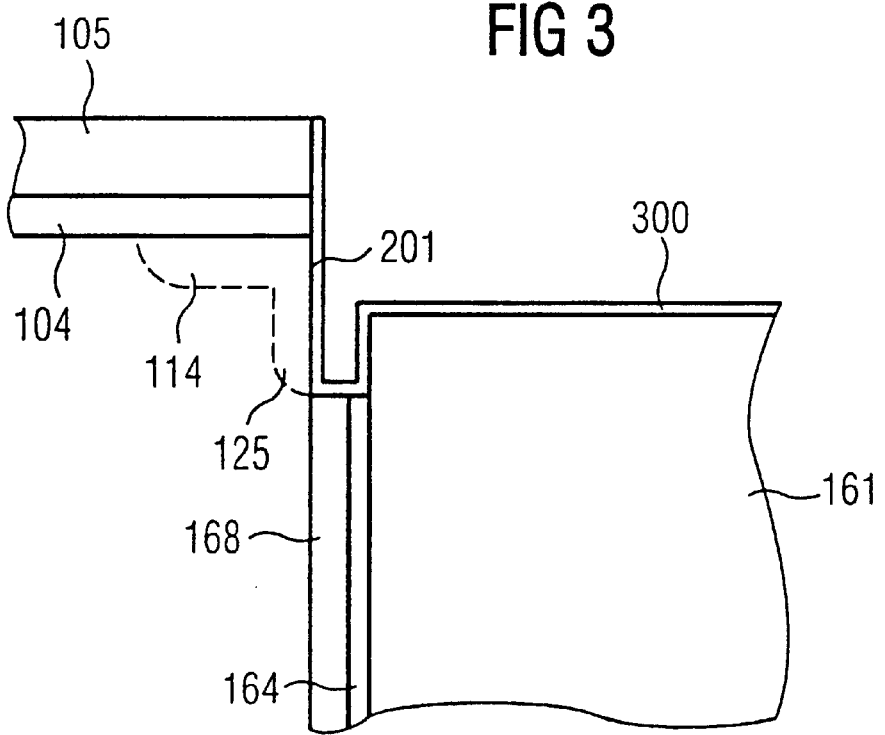
Figure 6:
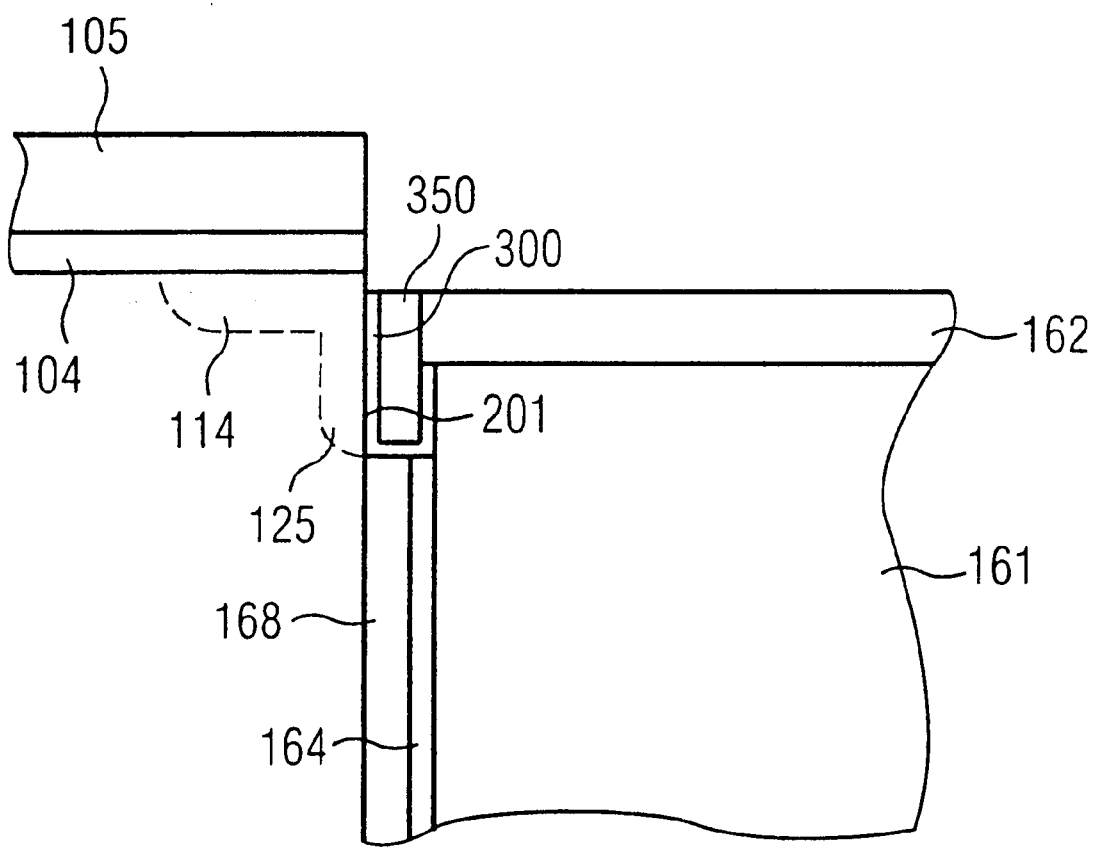

The process stage shown in FIG. 2 is followed by the application of a tunnel oxide layer to the polysilicon filling 161 and the interface 201 at which the contact with the selection transistor is to be formed. The thickness of the tunnel oxide depends on the desired operating conditions. Although it is specified as an oxide layer in this embodiment, said tunnel layer may also be a nitride layer or an oxide-nitride layer. The state manifested after the formation of the tunnel oxide 300 is shown in FIG. 3.

Polysilicon 350 is then deposited over the resulting structure as a protective layer. This is essential for the so-called cycle stability of the relevant EEPROM cell and additionally enables anisotropic etching in a later step. The state after the deposition of the polysilicon layer 350 is shown in FIG. 4.

The anisotropic etching indicated then follows, for example by means of reactive ion etching, in order to remove the tunnel oxide layer 300 and the protective layer 350 from the conductive polysilicon 161, the two layers remaining in the region of the interface 201, however. The process state after etching is shown in FIG. 5.

At this point, if desired, as already described above, the process block (photographic technique, etching) for removing the protective layer 350 and tunnel layer 300 in DRAM regions is carried out.

The next step (FIG. 6) as known from the standard process, is that the polysilicon layer 162 is deposited over the whole area of the resulting structure and is planarized and is also etched back in the region of the trench 108.

The next step that is carried out is the known formation of the STI insulation trench 180, as explained in more detail with reference to the DRkM standard process in connection with FIG. 7.

The essential process steps of the embodiment of the invention's process for fabricating an EEPROM memory cell are thus specified. All further process steps are carried out exactly as in the case of the known DRAM process.

The qualitative function of the EEPROM produced by the fabrication method according to the invention is explained in more detail below.

In comparison with the known DRAM memory cell, the writing and reading operations require a few modifications, in particular erasure in this process variant is only possible simultaneously for all cells of a block. In this case, a block is a combination of EEPROM cells—defined by photographic technique and implantation—across a contiguous buried well region (170 in FIG. 11) which is led through an n-type well (not shown) upward to the substrate surface.

In functional operation, this EEPROM memory cell is then charged positively in order to write a logic "1" via the tunnel oxide. In order to write a logic "0", nothing is done at all, that is to say the cell is left in its more negative state after erasure. By virtue of the positive charge (logic "1"), the parasitic transistor produced from the DRAIN region of the selection transistor to the buried layer is turned on. In other words, this vertical transistor is turned on if a "1" has been written, and it is turned off if a "0" has been written, that is to say nothing has been done. These two states of the parasitic transistor can then be utilized for reading purposes, in which case a virtually complete analogy to the reading operation in the corresponding DRAM memory can be preserved. In particular, the bit line of the cell to be evaluated is charged for example to 1.1 volts, and the reference bit line belonging to the cell is put at 0.9 volt (asymmetric precharge). A logic "0" is simulated by the 1.1 volts, since the voltage on the bit line does not change in this case. The selection transistor of the cell is activated, that is to say the word line is switched to "h". If the parasitic transistor is turned on, that is to say logic "1", the potential on the bit line changes from 1.1 volts to below 0.9 volts, that is to say 0.5 volt, for example. If the transistor is turned off, that is to say, logic "0", the potential remains at 1.1 volts, that is to say above 0.9 volts. These potentials are then amplified by the sense amplifier in a known manner and forwarded to the outside.

For erasure, a corresponding negative potential is applied to the $p^{++}$-type region via the rear side of the wafer, and the tunnel effect is utilized again, the charge flowing via the cell dielectric, however. The parameters for the tunnel oxide, the trench depth, the trench dielectric, etc., will need to be adapted to the respective application.

Although the present invention has been described above using preferred exemplary embodiments it is not restricted thereto but rather can be modified in diverse ways.

In particular, the materials referred to are only by way of example and can be replaced by other materials having suitable properties. The same applies to the cleaning and doping, thermal growth and/or deposition processes mentioned.

Although an oxide, nitride or oxynitride layer have been mentioned, in particular, as the tunnel layer, any layer which does not rupture during He thermal process steps typically of 1100° C., but rather permits the highest possible tunneling current, is suitable, in principle.

What is claimed is:

1. A method for fabricating an EEPROM memory cell having a trench capacitor, which comprises:

providing a substrate having a weakly doped epitaxial layer and a more heavily doped layer disposed under the weakly doped epitaxial layer;

forming a trench in the substrate, the trench having a lower region and an upper region, the lower region at least partially in the weakly doped epitaxial layer;

filling the lower region of the trench with a first filling material;

forming an insulation collar in the upper region of the trench;

removing the first filling material from the lower region of the trench;

forming a buried plate as a first capacitor plate in the lower region of the trench in the weakly doped epitaxial layer;

filling the trench with a conductive second filling material to form a second capacitor plate;

providing a capacitor dielectric between the conductive second filling material and the buried plate;

forming a dielectric tunnel layer in the trench at an interface of a buried contact and an associated selection transistor; and forming a conductive protective layer on the dielectric tunnel layer.

2. The method according to claim 1, wherein the dielectric tunnel layer is at least one of an oxide layer, a nitride layer, and an oxynitride layer.

3. The method according to claim 1, wherein the substrate is a heavily p-doped semiconductor material having a buried well with n-type doping and a region with weak p-doping disposed above the buried well, the region with weak p-doping having formed therein the buried contact with the associated selection transistor.

4. The method according to claim 1, which further comprises:

removing the conductive second filling material and the insulation collar in the upper region of the trench to uncover the buried contact with the associated selection transistor;

carrying out the tunnel layer forming step by applying the dielectric tunnel layer on the interface of the buried contact and the conductive second filling material;

carrying out the protective layer forming step by applying the conductive protective layer on the tunnel layer; and anisotropically etching the conductive protective layer and the tunnel layer resulting in the removal of the protective layer and the tunnel layer from the conductive second filling material, with the protective layer and the tunnel layer remaining in a region of the interface of the buried contact and the conductive second filling material.

5. The method according to claim 3, which further comprises:

removing the conductive second filling material and the insulation collar in the upper region of the trench to uncover the buried contact with the associated selection transistor;

carrying out the tunnel layer forming step by applying the dielectric tunnel layer on the interface of the buried contact and the conductive second filling material;

carrying out the protective layer forming step by applying the conductive protective layer on the tunnel layer; and anisotropically etching the conductive protective layer and the tunnel layer resulting in the removal of the protective layer and the tunnel layer from the conductive second filling material with the protective layer and the tunnel layer remaining in a region of the interface of the buried contact and the conductive second filling material.

6. The method according to claim 4, which further comprises:

after the anisotropic etching, forming a strap above the insulation collar and on the conductive second filling material to the protective layer, the strap being made from a conductive third filling material;

planarizing and sinking the strap; and forming an STI trench in the upper portion of the trench for insulating the EEPROM cell from other cells in an EEPROM matrix and for preventing strap formation between adjacent capacitors.

7. The method according to claim 5, which further comprises:

after the anisotropic etching, forming a strap above the insulation collar and on the conductive second filling material to the protective layer, the strap being made from a conductive third filling material;

planarizing and sinking the strap; and forming an STI trench in the upper portion of the trench for insulating the EEPROM cell from other cells in an EEPROM matrix and for preventing strap formation between adjacent capacitors.

8. The method according to claim 6, wherein the second and third conductive filling material is polysilicon.

9. The method according to claim 7, wherein the second and third conductive filling material is polysilicon.

10. The method according to claim 6, which further comprises recessing the dielectric tunnel layer to define DRAM regions.

* * * * *